US006608849B2

(12) United States Patent
Mawst et al.

(10) Patent No.: US 6,608,849 B2
(45) Date of Patent: Aug. 19, 2003

(54) VERTICAL-CAVITY SURFACE-EMITTING SEMICONDUCTOR LASER ARRAYS

(75) Inventors: Luke J. Mawst, Sun Prairie, WI (US); Delai Zhou, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 09/880,659

(22) Filed: Jun. 13, 2001

(65) Prior Publication Data

US 2002/0191656 A1 Dec. 19, 2002

(51) Int. Cl.$^7$ .................................................. H01S 5/00
(52) U.S. Cl. ............................. 372/43; 372/43; 372/45; 372/46; 372/50
(58) Field of Search ............................ 372/43, 45, 46, 372/50

(56) References Cited

U.S. PATENT DOCUMENTS

| 5,086,430 | A | | 2/1992 | Kapon et al. | |
| 5,255,278 | A | | 10/1993 | Yamanaka | |
| 5,263,041 | A | | 11/1993 | Pankove | |
| 5,838,715 | A | * | 11/1998 | Corzine et al. | 372/96 |
| 6,031,243 | A | * | 2/2000 | Taylor | 257/13 |
| 6,256,333 | B1 | * | 7/2001 | Johnson | 372/96 |

OTHER PUBLICATIONS

G. Ronald Hadley, "Effective Index Model for Vertical–Cavity Surface–Emitting Lasers," Optics Letters, vol. 20, No. 13, Jul. 1, 1995, pp. 1483–1485.
C. Jung, et al., "4.8 mW Singlemode Oxide Confined Top–Surface Emitting Vertical–Cavity Laser Diodes," Electronics Letters, vol. 33, No. 21, Oct. 9, 1997, pp. 1790–1791.
K.D. Choquette, et al., "Leaky Mode Vertical Cavity Lasers Using Cavity Resonance Modification," Electronics Letters, vol. 34, No. 10, May 14, 1998, pp. 991–992.
Darwin K. Serkland, et al., "Two–Element Phased Array of Antiguided Vertical–Cavity Lasers," Applied Physics Letters, vol. 75, No. 24, Dec. 1999, pp. 3754–3756.
D. Zhou and L.J. Mawst, "Simplified–Antiresonant Reflecting Optical Waveguide (S–ARROW)–type VCSELs," Conf. Proc. of IEEE LEOS 12th Annual Meeting, San Francisco, CA, Nov. 1999, Proc. IEEE, vol. 1, p. 393.
D. Zhou and L.J. Mawst, "Simplified–Antiresonant Reflecting Optical Waveguide–Type Vertical–Cavity Surface-Emitting Lasers," Applied Physics Letters, vol. 76, No. 13, Mar. 27, 2000, pp. 1659–1661.
"VCSELs Radiate in Harmony," Laser Focus World, Nov., 2000, pp. 17–18.

* cited by examiner

*Primary Examiner*—Eddie Lee
*Assistant Examiner*—Joseph Nguyen
(74) *Attorney, Agent, or Firm*—Foley & Lardner

(57) ABSTRACT

A vertical-cavity surface-emitting semiconductor laser array device includes a semiconductor substrate and a multilayer structure on the substrate that includes at least four core elements arranged in a two-dimensional rectangular array, with the core elements separated from one another and surrounded by a matrix region formed to have an effective higher index than the core elements for antiguiding of the radiation leakage from the core elements. The width of the matrix region separating adjacent core elements may be selected to provide either in-phase or out-of-phase resonant coupling between the adjacent core elements, and the matrix region and upper and lower reflectors are positioned to act upon the light generated in an active region layer to produce lasing action phase-locked between the core elements to produce emission of light from at least one of the upper or lower faces of the semiconductor laser array.

29 Claims, 5 Drawing Sheets

VERTICAL-CAVITY SURFACE-EMITTING SEMICONDUCTOR LASER ARRAYS

STATEMENT OF GOVERNMENT RIGHTS

This invention was made with United States government support awarded by the following agency: NSF 9734283. The United States government has certain rights in this invention.

FIELD OF THE INVENTION

This invention pertains generally to the field of semiconductor diode lasers and particularly to vertical-cavity surface-emitting laser arrays.

BACKGROUND OF THE INVENTION

Vertical-cavity surface-emitting lasers (VCSELs) have several significant advantages including low-threshold, high-fiber coupling efficiency, and a compact size that is well suited to integration. In addition, VCSELs also have a simplified fabrication process as compared to edge-emitting distributed feedback lasers and allow wafer level characterization, which provides significant advantages in the manufacturing of such devices. A shortcoming of current VCSELs is the relatively low power output for single mode operation. Coupled arrays of VCSELs offer the potential to increase the coherent output power available from single VCSELs. However, stable, high-power diffraction limited beam operation from two-dimensional (2D) VCSEL arrays has not been realized. See, e.g., J. P. Van der Ziel, et al., IEEE J. Quantum Electron., Vol. 26, 1990, pp. 1873, et seq.; M. Orenstein, et al., Appl. Phys. Lett., Vol. 58, 1991, pp. 804, et seq.; R. A. Morgan, et al., Appl. Phys. Lett., Vol. 61, 1992, pp. 1160, et seq. In addition, prior phase-locked 2D VCSEL arrays operate in either an out-of-phase mode or a mixture of various modes, characteristic of weakly index guided arrays, with poor intermodal discrimination. External phase shifters have been used on optically pumped VCSEL arrays to obtain "in-phase mode-like" emission, but with a relatively broad beam. M. E. Warren, et al., Appl. Phys. Lett., Vol. 61, 1992, pp. 1484, et seq.

The limitations encountered in the development of 2D VCSEL arrays parallels that encountered in the development of edge-emitting phase-locked arrays. Weak coupling and poor intermodal discrimination found in evanescently coupled edge-emitting laser arrays has severely limited their single-mode output power. See, K. L. Chen, et al., Appl. Phys. Lett., Vol. 47, 1985, pp. 555, et seq. In contrast, antiguided array structures exhibit strong leaky-wave coupling, leading to high intermodal discrimination. As a result, edge-emitting antiguided arrays have demonstrated coherent output power in the watt range. See, D. Botez, et al., IEEE J. Quantum Electron., Vol. 26, 1990, pp. 482, et seq. The large built-in index step and strong lateral radiation leakage from an antiguide are well suited for array integration. Antiguided VCSELs have been demonstrated by the regrowth of high-index material and a buried heterostructure design (Y. A. Wu, et al., IEEE J. Sel. Top. Quantum Electron., Vol. 1, 1995, pp. 629, et seq.), by selective oxidation (T. H. Oh, et al., IEEE Photonics Technol. Lett., Vol. 10, 1998, pp. 12, et seq.), or by a cavity-induced resonant shifted structure (K. D. Choquette, et al., Electron. Lett., Vol. 34, 1998, pp. 1991, et seq.). Leaky-wave coupling between two antiguided VCSELs (coupled in-phase or out-of-phase) has been demonstrated using structures fabricated with a cavity-induced resonant shift. Serkland, et al., Appl. Phys. Lett., Vol. 75, 1999, pp. 3754, et seq.

SUMMARY OF THE INVENTION

In accordance with the invention, stable, diffraction limited output at high power levels is obtained from an array of antiguided phase-locked vertical cavity surface-emitting laser arrays. The arrays may be fabricated by a selective etching process and regrowth by metalorganic chemical vapor deposition processes. Resonant coupling of the array of elements occurs with interelement spacings corresponding to an odd (or even) integral number of half waves of the antiguided radiation leakage. Interelement loss may be incorporated in the structure to effectively suppress nonresonant modes.

The laser array device in accordance with the invention includes a semiconductor substrate and a multilayer structure on the substrate. The multilayer structure includes a layer with an active region at which light emission occurs, upper and lower layers surrounding the active region layer, upper and lower faces, and electrodes by which voltage can be applied across the multilayer structure and the substrate. At least four core elements are formed in the multilayer structure arranged in a two-dimensional array, the core elements being separated from one another and surrounded by a matrix region formed to have an effective higher index than the core elements for antiguiding of the radiation leakage from the core elements. The matrix region may also include material providing loss for the radiation in the interelement regions. The width of the matrix region separating adjacent core elements is selected to provide resonant coupling between the core elements. The spacing between core elements may be selected to be substantially equal to an odd integral number of half wavelengths of the antiguided radiation leakage for in-phase coupling, or an even integral number of half wavelengths for out-of-phase coupling. The device is preferably close to the resonance condition, but does not need to be exactly resonant. Operation close to resonance provides strong optical coupling throughout the array, resulting in a nearly uniform near-field intensity. The uniform near-field intensity reduces the influence of non-linear effects above laser threshold, helping to suppress the onset of lasing in other modules. Near the resonance condition, a combination of mode dependent edge losses and interelement losses acts to suppress unwanted modes (i.e., nonresonant modes). An upper reflector above the active region layer and a lower reflector below the active region layer provide vertical confinement of the emitted radiation. The matrix region and the upper and lower reflectors are positioned to act upon the light generated in the active region to produce lasing action phase-locked between the core elements to produce emission of light from at least one of the upper and lower faces of the semiconductor structure. Means for confining the current from the electrodes to the array of core elements may be incorporated in the multilayer structure.

The core elements may be formed as a square, and the core elements may be arranged in rows and columns in the array with equal spacing between the core elements in the rows and columns. The core elements may also be arranged in various array geometries in addition to rectangular, e.g., triangular, etc. The laser array may be formed to either be top surface emitting or bottom surface emitting. For top surface emission, an upper electrode formed on the top face of the structure may include a plurality of openings therein each formed above a core element to define the output aperture for the light from each core element. For a bottom emitting laser, one of the electrodes may be formed over the upper face of the semiconductor laser, and another electrode is formed on the lower face over the substrate and has an opening therein under the array for passage of light therethrough to define the output aperture of the laser array. A heat sink may then be mounted in heat conductive contact with the electrode on the upper face of the semiconductor laser array to efficiently remove heat and allow the semiconductor array laser to operate at higher power levels.

The semiconductor laser array may be formed with various semiconductor materials used in the fabrication of semiconductor lasers. Exemplary structures may include substrates of crystalline GaAs with an active region layer formed of a multiple quantum well structure of layers of, e.g., GaInNAs and GaAs or layers of GaAs and InGaAs. The upper and lower reflectors may be distributed Bragg reflectors formed of multiple pairs of layers, e.g., of AlGaAs and AlAs, AlAs and GaAs, etc.

The material of the higher effective index matrix regions may be selected to locally increase the cavity resonance wavelength to provide an effective equivalent increase in the index of the matrix region. For example, the matrix region may include one or more thin spacer layers of material, e.g., GaInP and GaAs, between layers of an upper distributed Bragg reflector to provide the effective local increase in the cavity resonance wavelength in the matrix region. An additional layer of material, e.g., InGaAs or InGaAsN, may be incorporated in the spacer layers to provide loss in the interelement matrix regions.

Further objects, features and advantages of the invention will be apparent from the following detailed description when taken in conjunction with the accompanying drawings.

DETAILED DESCRIPTION OF THE INVENTION

Figure 1:
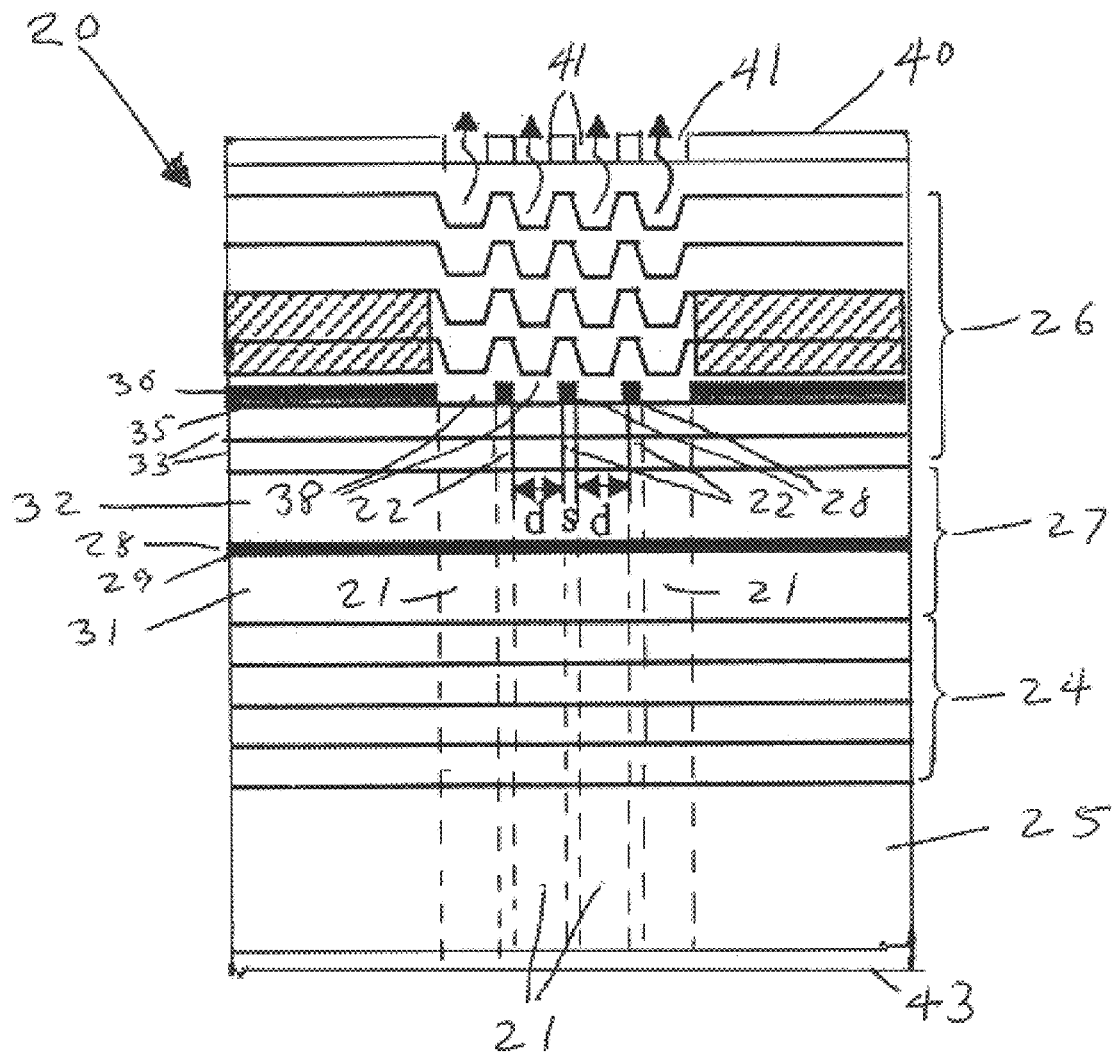
FIG. 1 is a simplified cross-sectional view of a vertical-cavity surface-emitting semiconductor laser array in accordance with the invention having an array of 16 core elements.
Figure 2:
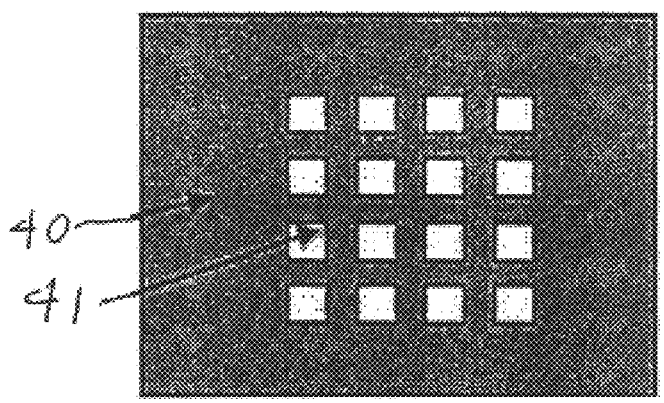
FIG. 2 is a simplified top view of the upper electrode for the semiconductor laser array of FIG. 1.
Figure 3:
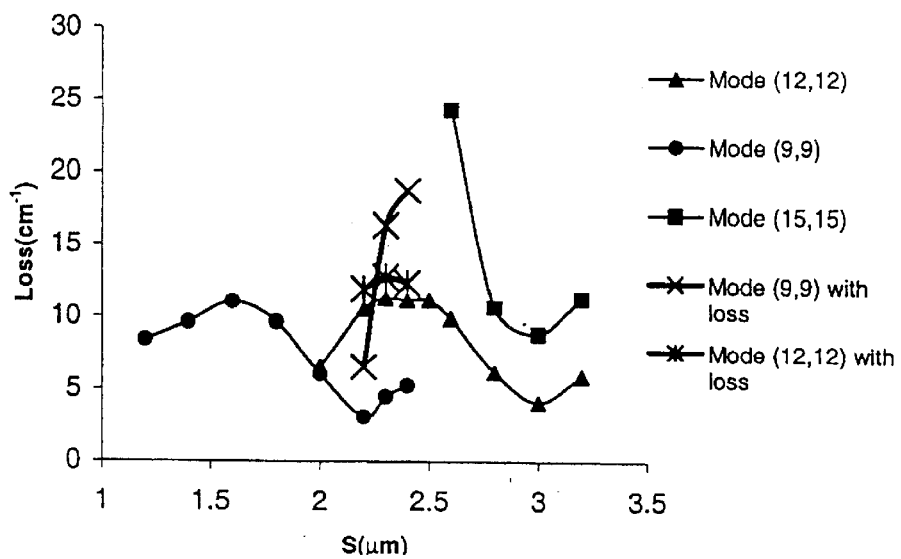
FIG. 3 are graphs of calculated modal edge radiation losses for the semiconductor laser array structure of FIGS. 2 and 3, for core elements with d=6 $\mu$m and an index step $\Delta$n=0.05, and also including graphs calculated radiation losses for the in-phase (12, 12) and out-of-phase (9,9) modes with an interelement loss of 100 cm$^{-1}$.

For purposes of exemplifying the invention, the leaky modes of a 4×4 antiguided VCSEL array structure as shown generally at 20 in FIGS. 1 and 2 may be analyzed using a fiber-mode effective-index approximation. The VCSEL structure 20 of FIGS. 1 and 2 supports leaky modes with the core elements 21 phase-locked in-phase or out-of-phase, as well as intermediate modes with varying phase relationships between core elements. Edge radiation losses and absorption losses selectively placed in the interelement matrix regions 22 of the array can discriminate against unwanted modes. The calculated modal edge radiation losses for the in-phase mode, (12, 12) and the two out-of-phase modes, (9,9), and (15, 15), for a 4×4 array structure with 6 $\mu$m wide (square) VCSEL core elements, with an index-step of $\Delta$n=0.05 between the core elements and the higher index matrix region 22 that surrounds and separates the core elements, are shown in FIG. 3. The mode number convention corresponds to the number of intensity nulls of the field profile in each direction. For this structure, the in-phase mode exhibits resonant leaky-wave coupling for an interelement matrix region spacing of s=2.4 $\mu$m, since the interelement region contains an odd number of half-waves, $\lambda_1$, of the radiation leakage (i.e., s=3$\lambda_1$/2). Near the resonance condition for the in-phase mode, the in-phase mode has uniform intensity profile and highest edge loss (see FIG. 3), similar to what is seen in 1D edge-emitting arrays. The out-of-phase mode [mode (9,9), for s<2.4 $\mu$m] is nonresonant and thus exhibits strong reflections in the interelement regions, resulting in high-interelement field intensity and a nonuniform (cosine-shaped) intensity profile. Some coupling and interference also occurs between diagonally adjacent elements in the array.

In edge-emitting antiguided arrays, the 2D gain overlap suppresses nonresonant modes because they exhibit high field intensity in the (low gain) interelement regions. However, in the antiguided VCSEL array, the 2D gain overlap is not expected to be significantly mode dependent, because of the uniform gain profile. Therefore, the implementation of interelement loss into the 2D VCSEL array structure can be used to select the resonant mode by suppressing nonresonant modes that have high field intensity in the interelement regions. This effect is demonstrated in FIG. 3, where the influence of interelement loss (for example, 100 cm$^{-1}$) on the total modal losses for the in-phase mode (12, 12) and the lower out-of-phase mode (9,9) is also shown. As a result, for s>2.3 $\mu$m, both of the out-of-phase modes (9,9 and 15, 15) can be suppressed by either high-edge loss or interelement loss. Intermediate (adjacent) array modes are also found to have high edge losses, thereby suppressing their lasing, near the in-phase resonance condition. Thus, as shown in FIG. 3, a 4×4 array structure designed with interelement loss and an interelement width in the range s=2.3–2.8 $\mu$m can operate in a stable in-phase array mode.

As an example, 4×4 VCSEL antiguided array structures as shown in FIGS. 1 and 2 were fabricated using a two-step MOCVD growth process. The structure includes a lower n-type distributed Bragg reflector (DBR) 24 grown on a GaAs substrate 25 formed of 27.5 pairs of AlAs/GaAs layers, an upper p-type DBR 26 formed of 23 pairs of Al$_{0.15}$GaAs/AlAs layers, and a 1 $\lambda$ optical cavity 27 which includes three InGaAs quantum wells 28 with GaAs barrier layers 29, and Al$_{0.3}$GaAs confinement layers 31 and 32 for 980 nm emission. The first growth consists of the n-DBR 24, cavity 27, one or more pairs of p-DBR 33 (GaAs/AlAs) and two thin spacer layers of GaInP 35 and GaAs 36. These two thin layers were selectively etched away at the emitting core elements areas 38, and then the remaining layers of the upper p-DBR 26 were regrown. This structure provides the required index step for antiguiding due to the shift of optical resonant mode in the regions containing the spacer layers 35 and 36. In this example, each emitting core element is a 6 μm square, with an index step of Δn=0.05. The interelement (high-index) matrix region width, s (the spacing between the core elements), was adjusted to select either the in-phase or out-of-phase resonance condition. These structures can also be formed to include absorbing layers for interelement loss to aid in the suppression of nonresonant modes. As shown in FIG. 2, the top face of the semiconductor structure has a metal electrode 40 formed thereon with a plurality of openings 41 formed therein, with each opening formed above a core element 21 to define the output aperture for the light from each core element. For example, for 6 μm by 6 μm square core elements, the openings 41 may be formed as 5 μm by 5 μm squares. A lower electrode 43 may be formed on the bottom face of the substrate 25 so that voltage can be applied across the semiconductor structure between the electrodes 40 and 43.

Figure 4:
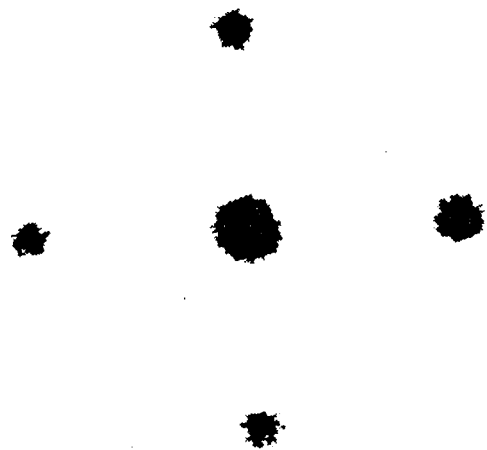
FIG. 4 is an illustrative view of the measured continuous wave (cw) far-field pattern for the device of FIGS. 1 and 2 operating in the in-phase mode.
Figure 5:
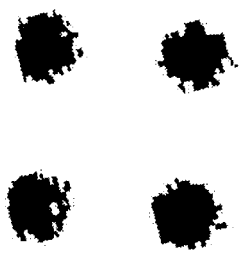
FIG. 5 is an illustrative view of the measured cw far-field pattern for the device of FIGS. 1 and 2 operating in the out-of-phase mode.
Figure 6:
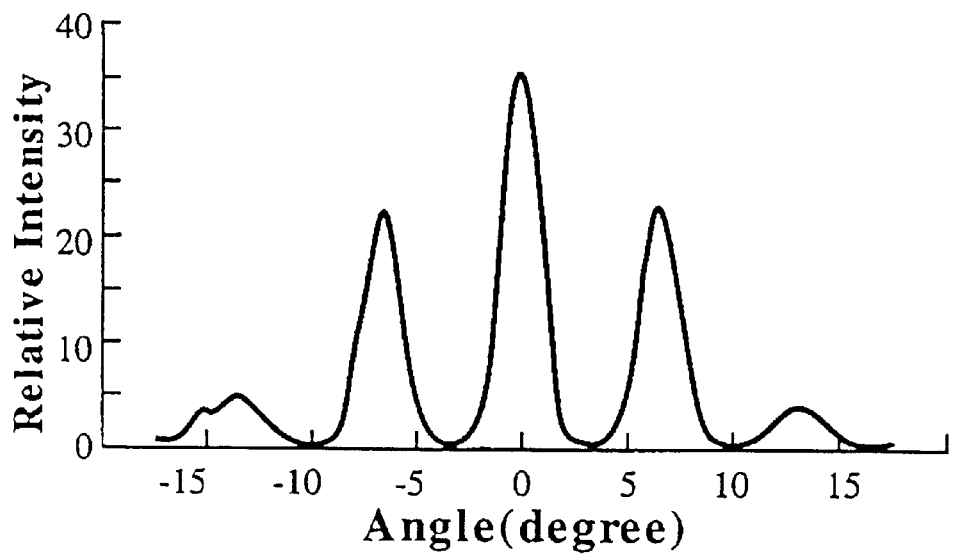
FIG. 6 is a one-dimensional scan of the cw far-field intensity for the device of FIGS. 1 and 2 functioning in the in-phase mode.
Figure 7:
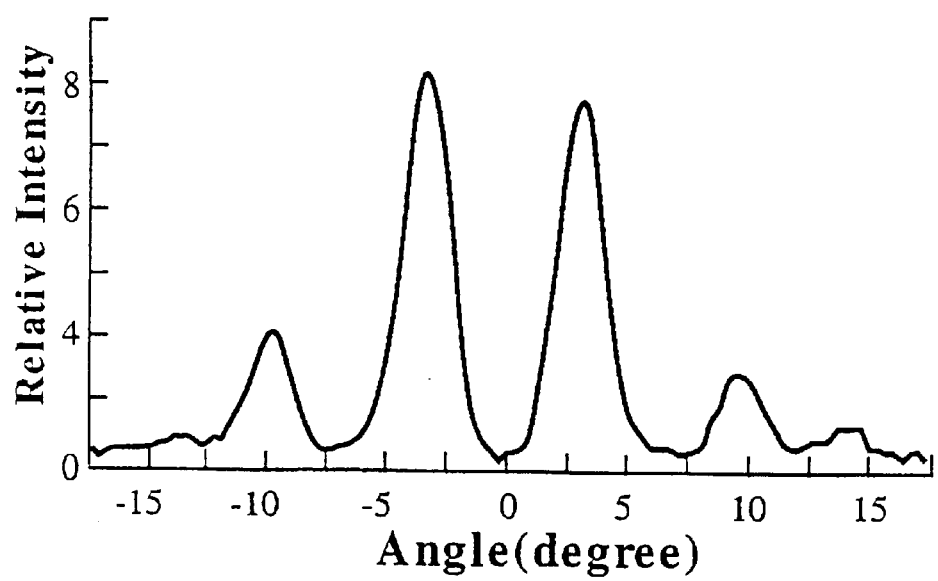
FIG. 7 is a one-dimensional scan of the cw far-field intensity for the device of FIGS. 1 and 2 operating in the out-of-phase mode.

Arrays with interelement widths s=2.5 μm are observed to operate in an in-phase mode. Arrays with interelement width s=3.0 μm are observed to operate in an out-of-phase mode. This result is in general agreement with the calculations shown in FIG. 3, provided that the modal loss curves are shifted towards higher s values by about 0.5 μm. This shift can occur due to a smaller index step (Δn=0.036) than the design target of Δn=0.05. Since the fabricated structure does not contain interelement loss, the lasing modes observed correspond to either the nonresonant in-phase mode (for s=2.5 μm) or the nonresonant out-of-phase mode (for s=3.0 μm). The measured cw far-field emission pattern for an array with s=2.5 μm (in-phase) and s=3.0 μm (out-of-phase), as captured by a CCD camera, are shown near laser threshold in FIGS. 4 and 5, respectively. At higher driving currents, the minor side lobes become viewable. The angular lobe separation and widths are obtained from a 1D scan of the far-field intensity for the two arrays, as shown in FIGS. 6 and 7, respectively. The full width half maximum (FWHM) for the in-phase mode is about 2°, and the side lobes separation is 13.5°. The emission patterns remain stable up to the maximum thermally limited cw output power (~1–2 mW). Higher cw output powers are mainly limited due to the intensive heating for such closely packed arrays.

Figure 8:
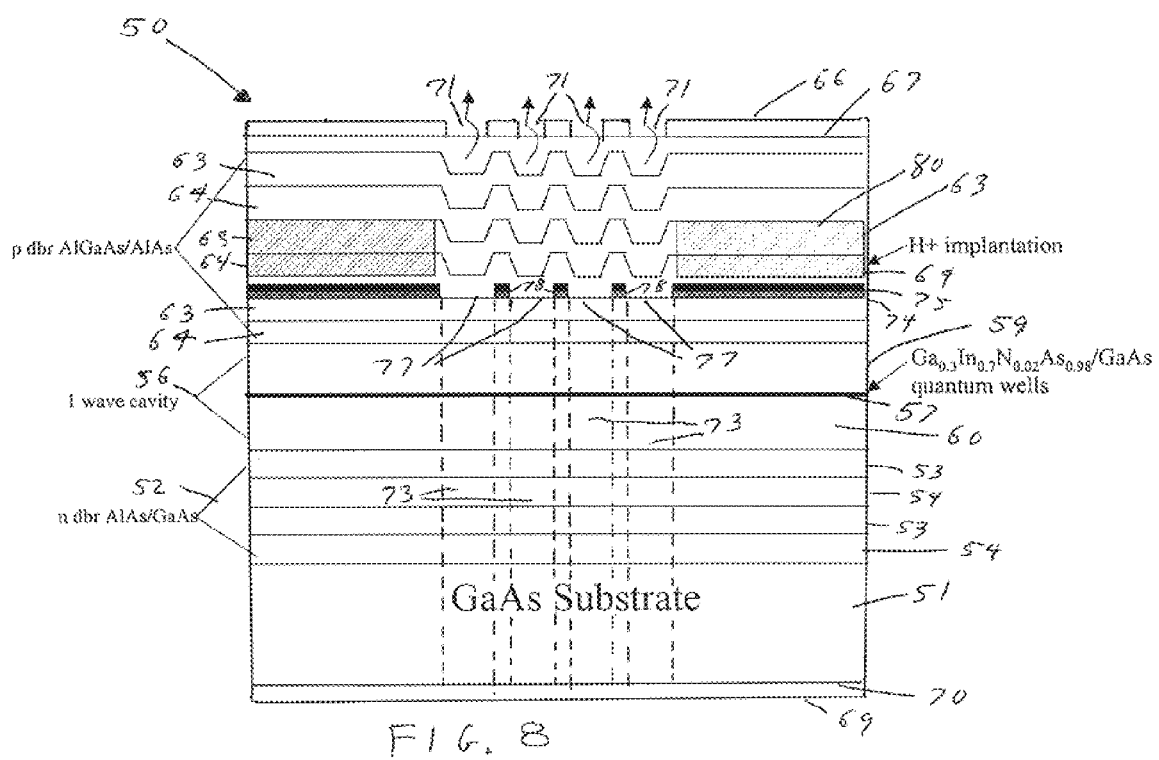
FIG. 8 is a simplified cross-sectional view of a semiconductor laser array structure utilizing a material system that provides top surface light emission at 1.3 $\mu$m.

The present invention may be implemented utilizing other material systems to obtain light emission at other wavelengths, as desired. An example of another vertical-cavity surface-emitting semiconductor laser array in accordance with the invention formed to emit light at 1.3 μm is shown generally at 50 in FIG. 8. The laser array 50 includes a substrate 51 of GaAs, a lower n-type distributed Bragg reflector (n-DBR) 52 formed of multiple pairs of layers of AlAs and GaAs 53 and 54 (two pairs shown for illustration; typically 20 to 30 pairs may be utilized), a one wavelength cavity 56 including an active region layer 57 having GaIn-NAs quantum wells in layers of GaAs, and an upper confinement layer 59 and a lower confinement layer 60. An upper p-type distributed Bragg reflector (p-DBR) 62 is formed of multiple pairs of layers of AlGaAs and AlAs 63 and 64 (typically 20 to 30 pairs of layers may be utilized). An upper metal electrode 66 is formed on the top face 67 of the semiconductor structure and a lower metal electrode 69 is formed on the lower face 70 (the face of the substrate) of the semiconductor structure. The upper electrode 66 has a plurality of openings 71 formed therein, each opening positioned above a core element 73 of a two-dimensional array of core elements arranged similarly to the array of FIGS. 1 and 2. Two thin spacer layers 74 and 75 formed of GaInP and GaAs, respectively, are formed in the upper DBR 62 and are etched, as discussed above, to form a two-dimensional array of areas 77 corresponding to the position of the core elements 63 in the array, separated by regions 78 of the layers 74 and 75 and bounded by the rest of the layers 74 and 75. Proton implantation is applied to areas 80 of one or more pairs of DBR layers 63 and 64 outside of the array of core elements 73 as a means to confine current flowing between the upper electrode 66 and lower electrode 69 to the area of the array. Any other means for confining current to the area of the array may be used, one example of which is a blocking layer. The interelement sections 78 of the layers 74 and 75 define matrix regions in the semiconductor structure which have a higher effective index than the core element 73, and the width of the separating regions 78 is selected so that the core elements are separated by a distance that is an even or odd integral number of half wavelengths of the antiguided radiation leakage from the core elements. Interelement loss may be provided in the matrix regions to suppress nonresonant modes. For example, the spacer layer may include a layer of InGaAs with the layers of GaAs and GaInP to increase the loss in the matrix regions between the core elements 73.

Figure 9:
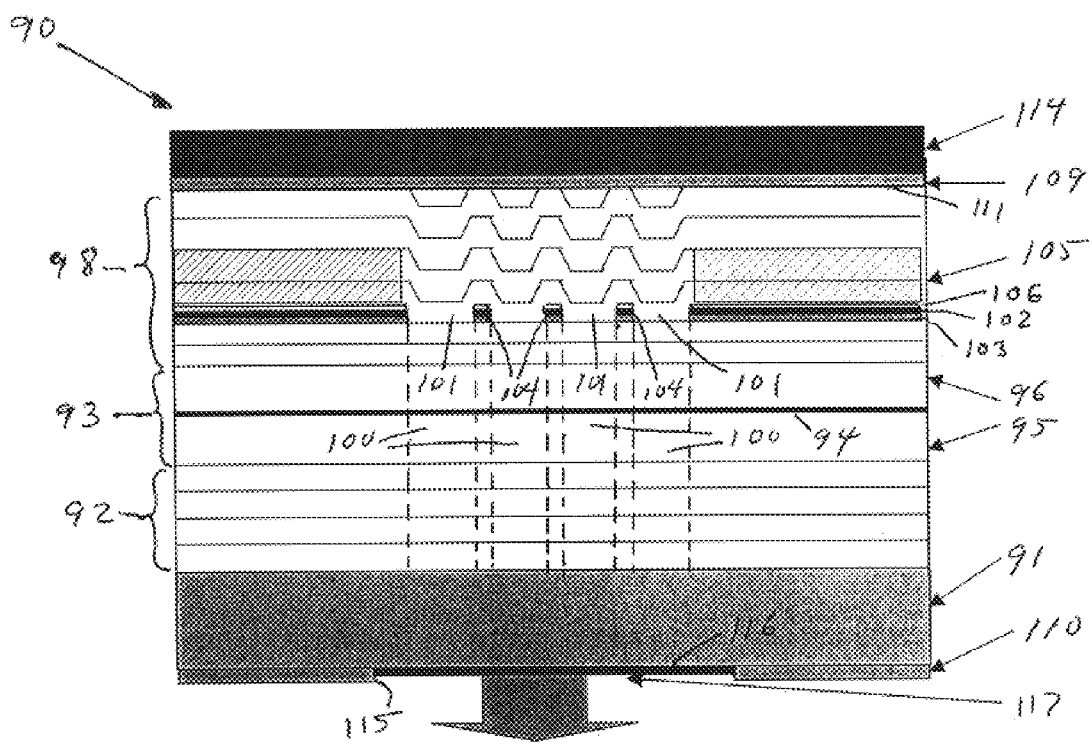
FIG. 9 is a simplified cross-sectional view of a semiconductor laser array structure providing bottom surface emission.

The invention may also be embodied in a semiconductor laser array that provides output emission through the substrate, as illustrated by the semiconductor structure 90 of FIG. 9. The semiconductor laser array 90 includes a substrate 91 (e.g., GaAs), a lower n-type distributed Bragg reflector 92 which may be formed of multiple pairs of layers as discussed above, a one wavelength cavity 93 having an active region layer 94 which includes multiple quantum wells, and a lower confinement layer 95 and an upper confinement layer 96 below and above the active region layer 94. These layers may be formed as discussed above or of any other desired appropriate material system. An upper p-type distributed Bragg reflector 98 is formed of multiple pairs of layers (e.g., as discussed above or of other appropriate material systems). A two-dimensional rectangular array of core elements 100 is defined by open areas 101 in spacer layers 102 and 103 of, e.g., GaInP and GaAs, formed in the upper DBR 98, as discussed above, which includes regions 104 that separate the open areas 101 to provide an effective higher index in the matrix regions of the semiconductor structure, surrounding and separating the core elements 100, than in the core elements. An absorption layer 106 of, e.g., InGaAs, may be included to introduce absorption loss to help suppress unwanted modes. A proton implantation into areas 105 of the DBR 98 around the array confines current flow between an upper electrode 109 and a lower electrode 110 to the area of the array. The upper p-metal electrode 109 covers the entire upper face 111 of the semiconductor structure including the area of the array of active core elements 100. A metal heat sink 114 may be mounted in heat conducting contact to the upper electrode 109 to conduct heat away from the semiconductor structure. An opening 115 is formed in the lower electrode 110 to expose an area 116 of the bottom face of the substrate of the semiconductor structure to allow emission of light therethrough. The exposed bottom face 116 preferably has an antireflective coating 117 formed thereon to facilitate emission of light through the window defined by the open face 116 of the structure. The semiconductor structure of FIG. 9 has the advantage that heat generated in the multilayer semiconductor structure can be readily conducted away by the heat sink 114 to allow the semiconductor structure to operate at relatively high power levels. Such a structure is well suited to large arrays of core elements, e.g., 20×20 element arrays or even longer. Generally, the core elements are arranged in rows and columns in a rectangular array with equal spacing between the core elements in the rows and columns.

The following is an exemplary process for producing the bottom emitting semiconductor laser array structure 90 of FIG. 9. Assuming an n-type substrate 91, a first MOCVD growth is utilized to grow the lower n-DBR 92, the one wave cavity 93, the spacer layers 102 and 103, and the first few pairs of layers of the upper p-DBR 98 up to the spacer layers 102 and 103. An array mask (e.g., 4×4 for a 4×4 array of openings) is utilized to selectively expose a photoresist and then etch away the spacer layers to form the openings 101 to define the antiguided array of core elements 100. A second MOCVD growth is then carried out to grow the remainder of the top p-DBR 98. A thick photoresist is then used to pattern the array to cover the area of the array to form an implantation mask for $H^+$ ion implantation. The implantation mask is then again used to pattern the array, to do a p-metal deposit and then liftoff, with this (e.g., gold) pattern then being used later for backside alignment. The backside (bottom face) of the substrate 91 is then lapped down about 200 μm and polished to form a polished lower face 116. A thick photoresist is then used to pattern the bottom face to define the window opening to be used for backside emission. Infrared illumination may be utilized for backside alignment. Thereafter n-metal is evaporated onto the backside face followed with a liftoff leaving the opening 115 exposing the bottom face 116. The top surface 111 may have p-metal deposited thereon by evaporation. An antireflective coating 117 may then be coated onto the open window area 116, and the backside window mask may then be used to etch away the coating on the lower electrode 110 to allow electrical contact to the bottom electrode 110. The contact is then preferably alloyed at, e.g., 380° C. for 30 seconds. The substrate wafer on which the multilayer structure is formed may then be scribed into individual devices for mounting. The individual devices are mounted with the p-metal side 109 down onto a heat sink (e.g., a copper block) 114, preferably with a diamond heat spreader between them.

Although the invention has been illustrated herein with core elements arranged in a rectangular two-dimensional array with equal spacing between the elements in the rows and columns, the invention may also be implemented with the core elements arranged in other types of two-dimensional array geometries, for example, triangular, etc.

It is understood that the invention is not confined to the particular embodiments set forth herein as illustrative, but embraces all such forms thereof as come within the scope of the following claims.

What is claimed is:

1. A vertical-cavity surface-emitting semiconductor laser array device comprising:

a semiconductor substrate and a multilayer structure on the substrate including a layer with an active region at which light emission occurs, upper and lower layers surrounding the active region layer, upper and lower faces, electrodes by which voltage can be applied across the multilayer structure and the substrate, at least four core elements arranged in a two-dimensional array, the core elements separated from one another and surrounded by a matrix region formed to have an effective higher index than the core elements for antiguiding of the radiation leakage from the core elements and arranged such that the device operates close to resonance to provide strong optical coupling throughout the array of elements, an upper reflector above the active region layer and a lower reflector below the active region layer, the matrix region and the upper and lower reflectors positioned to act upon the light generated in the active region to produce lasing action phase-locked between the core elements to produce emission of light from at least one of the upper and lower faces of the semiconductor laser array, and means for confining the current from the electrodes to the area of the array of core elements.

2. The semiconductor laser array device of claim 1 wherein the width of the matrix region separating adjacent core elements is selected to be an even or odd integral number of half wavelengths of the antiguided radiation leakage from the core elements.

3. The semiconductor laser array device of claim 1 wherein each of the core elements is formed as a square, and the core elements are arranged in rows and columns in the array with equal spacing between the core elements in the rows and columns.

4. The semiconductor laser array device of claim 1 wherein there are at least 16 core elements in the array.

5. The semiconductor laser array device of claim 1 wherein the means for confining the current to the array comprises proton implantation in regions of the multilayer structure surrounding the array.

6. The semiconductor laser array device of claim 1 wherein the electrodes are formed on the upper and lower faces of the semiconductor laser and the upper electrode has a plurality of openings therein with each opening formed above a core element to define the output aperture for the light from each core element.

7. The semiconductor laser array device of claim 1 wherein the material and thickness of the higher effective index matrix region is selected to locally increase the cavity resonance wavelength to provide an effective equivalent increase in the index in the matrix region.

8. The semiconductor laser array device of claim 1 wherein the upper and lower reflectors are distributed Bragg reflectors.

9. The semiconductor laser array device of claim 8 wherein the lower distributed Bragg reflector is formed of multiple pairs of layers of n-type AlAs and GaAs and the upper distributed Bragg reflector is formed of multiple pairs of layers of p-type AlGaAs and AlAs.

10. The semiconductor laser array device of claim 9 wherein the substrate is formed of GaAs, the active region layer is a multiple quantum well structure formed of layers of GaAs and InGaAs, and wherein the higher effective index matrix region includes a layer of GaInP and a layer of GaAs.

11. The semiconductor laser array device of claim 8 wherein a spacer layer is formed in the upper distributed Bragg reflector with an array of openings therein corresponding to the array of core elements, the spacer regions between the open areas of the spacer layer defining the higher effective index matrix regions surrounding and separating the core elements.

12. The semiconductor laser array device of claim 1 wherein the substrate is formed of GaAs, the upper reflector is a distributed Bragg reflector formed of multiple pairs of layers of p-type AlGaAs and AlAs, the lower reflector is a distributed Bragg reflector formed of multiple pairs of layers of n-type AlAs and GaAs, and the active region layer is a multiple quantum well structure formed of layers of GaInNAs and GaAs.

13. The semiconductor laser array device of claim 1 wherein one of the electrodes is formed on the upper face of the semiconductor laser and covers the area of the array and wherein another electrode is formed on the lower face of the semiconductor laser over the substrate and has an opening therein under the array for passage of light therethrough to define the output aperture of the laser array.

14. The semiconductor laser array device of claim 13 wherein the lower face of the semiconductor laser array through which light is emitted from the semiconductor laser array is coated with an antireflective coating.

15. The semiconductor laser array device of claim 13 further including a heat sink in heat conductive contact with the electrode on the upper face of the semiconductor laser array.

16. A vertical-cavity surface-emitting semiconductor laser array device comprising:

a semiconductor substrate and a multilayer structure on the substrate including a layer with an active region at which light emission occurs, upper and lower layers surrounding the active region layer, upper and lower faces, electrodes by which voltage can be applied across the multilayer structure and the substrate, at least four core elements arranged in a two-dimensional array, the core elements separated from one another and surrounded by a matrix region formed to have an effective higher index than the core elements for anti-guiding of the radiation leakage from the core elements and including material providing loss for the radiation in the interelement regions, the width of the matrix region separating adjacent core elements selected to provide in-phase resonant coupling of the antiguided radiation leakage between the core elements, an upper reflector above the active region layer and a lower reflector below the active region layer, the matrix region and the upper and lower reflectors positioned to act upon the light generated in the active region to produce lasing action phase-locked between the core elements to produce emission of light from at least one of the upper and lower faces of the semiconductor laser array, and means for confining the current from the electrodes to the area of the array of core elements.

17. The semiconductor laser array device of claim 16 wherein each of the core elements is formed as a square, and the core elements are arranged in rows and columns in the array with equal spacing between the core elements in the rows and columns.

18. The semiconductor laser array device of claim 16 wherein there are at least 16 core elements in the array.

19. The semiconductor laser array device of claim 16 wherein the means for confining the current to the array comprises proton implantation in regions of the multilayer structure surrounding the array.

20. The semiconductor laser array device of claim 16 wherein the electrodes are formed on the upper and lower faces of the semiconductor laser and the upper electrode has a plurality of openings therein with each opening formed above a core element to define the output aperture for the light from each core element.

21. The semiconductor laser array device of claim 16 wherein the material of the higher effective index matrix region is selected to locally increase the cavity resonance wavelength to provide an effective equivalent increase in the index in the matrix region.

22. The semiconductor laser array device of claim 16 wherein the upper and lower reflectors are distributed Bragg reflectors.

23. The semiconductor laser array device of claim 22 wherein the lower distributed Bragg reflector is formed of multiple pairs of layers of n-type AlAs and GaAs and the upper distributed Bragg reflector is formed of multiple pairs of layers of p-type AlGaAs and GaAs.

24. The semiconductor laser array device of claim 23 wherein the substrate is formed of GaAs, the active region layer is a multiple quantum well structure formed of layers of GaAs and InGaAs, and wherein the higher effective index matrix region with loss includes a layer of GaInP, a layer of InGaAs and a layer of GaAs.

25. The semiconductor laser array device of claim 22 wherein a spacer layer is formed in the upper distributed Bragg reflector with an array of openings therein corresponding to the array of core elements, the spacer regions between the open areas of the spacer layer defining the higher effective index matrix regions surrounding and separating the core elements.

26. The semiconductor laser array device of claim 16 wherein the substrate is formed of GaAs, the upper reflector is a distributed Bragg reflector formed of multiple pairs of layers of p-type AlGaAs and AlAs, the lower reflector is a distributed Bragg reflector formed of multiple pairs of layers of n-type AlAs and GaAs, and the active region layer is a multiple quantum well structure formed of layers of GaInNAs and GaAs.

27. The semiconductor laser array device of claim 16 wherein one of the electrodes is formed on the upper face of the semiconductor laser array and covers the area of the array and wherein another electrode is formed on the lower face of the semiconductor laser over the substrate and has an opening therein under the array for passage of light therethrough to define the output aperture of the laser array.

28. The semiconductor laser array device of claim 27 wherein the user face of the semiconductor laser array through which light is emitted from the semiconductor laser array is coated with an antireflective coating.

29. The semiconductor laser array device of claim 27 further including a heat sink in heat conductive contact with the electrode on the upper face of the semiconductor laser array.

* * * * *